(12) United States Patent
Zumkeller et al.

(10) Patent No.: US 10,879,095 B2
(45) Date of Patent: Dec. 29, 2020

(54) JIG FOR EVALUATING SEMICONDUCTOR PROCESSING CHAMBER

(71) Applicant: Samsung Electronics Co., Ltd., Suwon-si (KR)

(72) Inventors: Sean L. Zumkeller, Round Rock, TX (US); Robert J. Duperier, Austin, TX (US)

(73) Assignee: SAMSUNG ELECTRONICS CO., LTD.

(*) Notice: Subject to any disclaimer, the term of this patent is extended or adjusted under 35 U.S.C. 154(b) by 295 days.

(21) Appl. No.: 15/983,068

(22) Filed: May 17, 2018

(65) Prior Publication Data

US 2019/0267269 A1 Aug. 29, 2019

Related U.S. Application Data

(60) Provisional application No. 62/635,535, filed on Feb. 26, 2018.

(51) Int. Cl.
| | |
|---|---|
| *H01L 21/67* | (2006.01) |
| *H01L 21/673* | (2006.01) |
| *H01L 21/687* | (2006.01) |
| *H01L 21/677* | (2006.01) |

(52) U.S. Cl.
CPC .... *H01L 21/67288* (2013.01); *H01L 21/6719* (2013.01); *H01L 21/67253* (2013.01); *H01L 21/67383* (2013.01); *H01L 21/67386* (2013.01); *H01L 21/67748* (2013.01); *H01L 21/68707* (2013.01); *H01L 21/68785* (2013.01)

(58) Field of Classification Search
USPC ........ 33/501.08, 501.05, 613, 645, 652, 655
See application file for complete search history.

(56) References Cited

U.S. PATENT DOCUMENTS

| | | | | |
|---|---|---|---|---|
| 9,021,983 B2* | 5/2015 | Inanami | ............ | H01L 21/67288 |
| | | | | 118/663 |
| 2015/0340258 A1* | 11/2015 | Hiyashi | ............. | H01L 21/67772 |
| | | | | 414/416.03 |

FOREIGN PATENT DOCUMENTS

| | | | |
|---|---|---|---|
| JP | 60-167322 | * | 8/1985 |
| KR | 20060113158 A | | 11/2006 |
| KR | 20160017707 A | | 2/2016 |
| KR | 20160002142 U | | 6/2016 |
| KR | 20160077687 A | | 7/2016 |
| KR | 101716355 B1 | | 3/2017 |
| KR | 101800915 B1 | | 11/2017 |

* cited by examiner

*Primary Examiner* — Daniel S Larkin
(74) *Attorney, Agent, or Firm* — Renaissance IP Law Group LLP

(57) ABSTRACT

An apparatus includes an L-shaped structure and a bar-shaped member. The L-shaped structure has a first portion extending a first length and a second portion extending a second length. The first length is greater than the second length, and both the first length and the second length are greater than the width of L-shaped structure. The L-shaped structure detachably connects to one end of the bar-shaped member with an attachment structure, with a handle on an opposite end of the bar-shaped member. The L-shaped structure is shaped such that the L-shaped structure is configured to contact a lid of a processing chamber, and the L-shaped structure contacting the lid of the processing chamber indicates the lid is sagging out of tolerance.

20 Claims, 15 Drawing Sheets

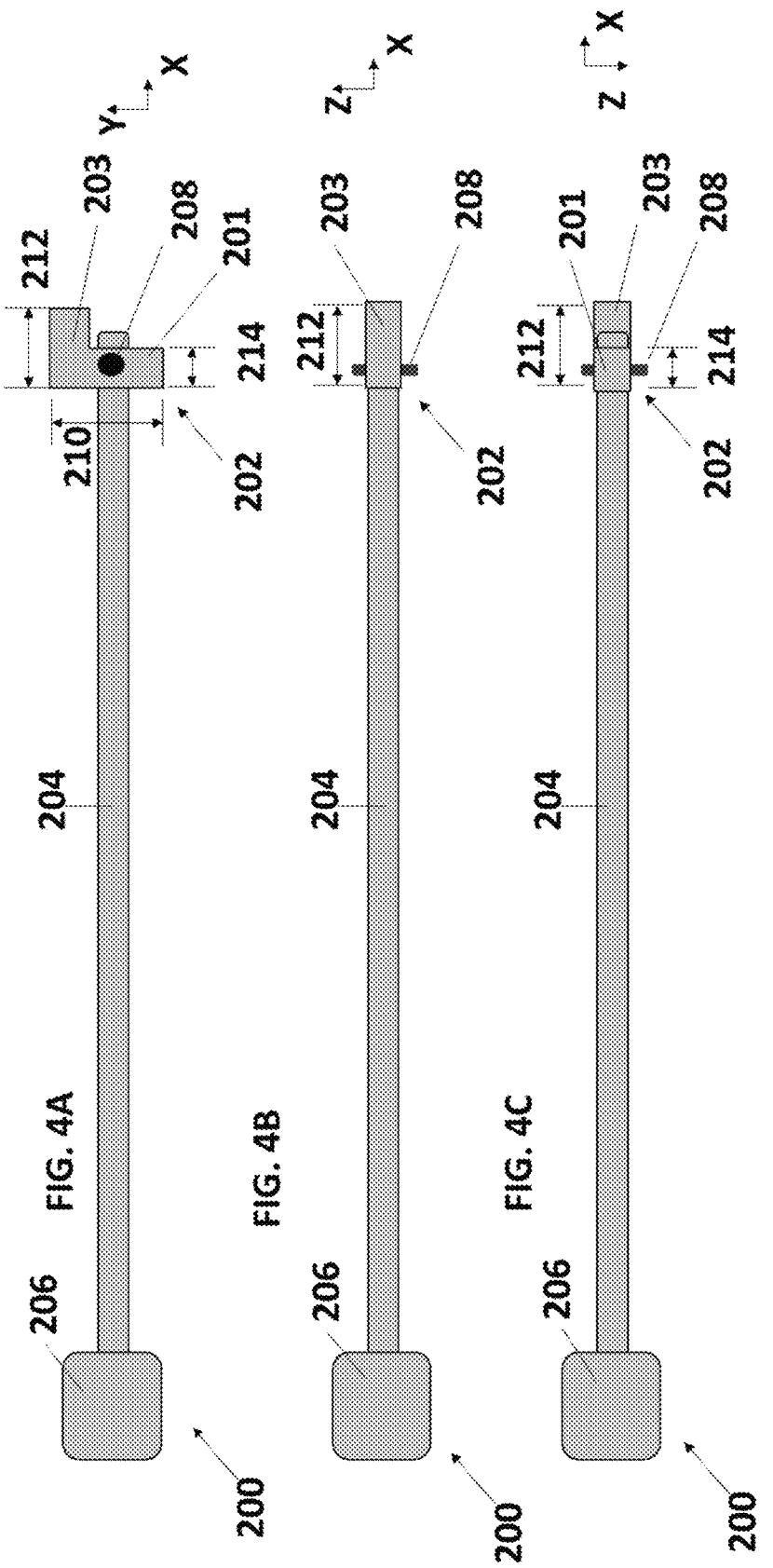

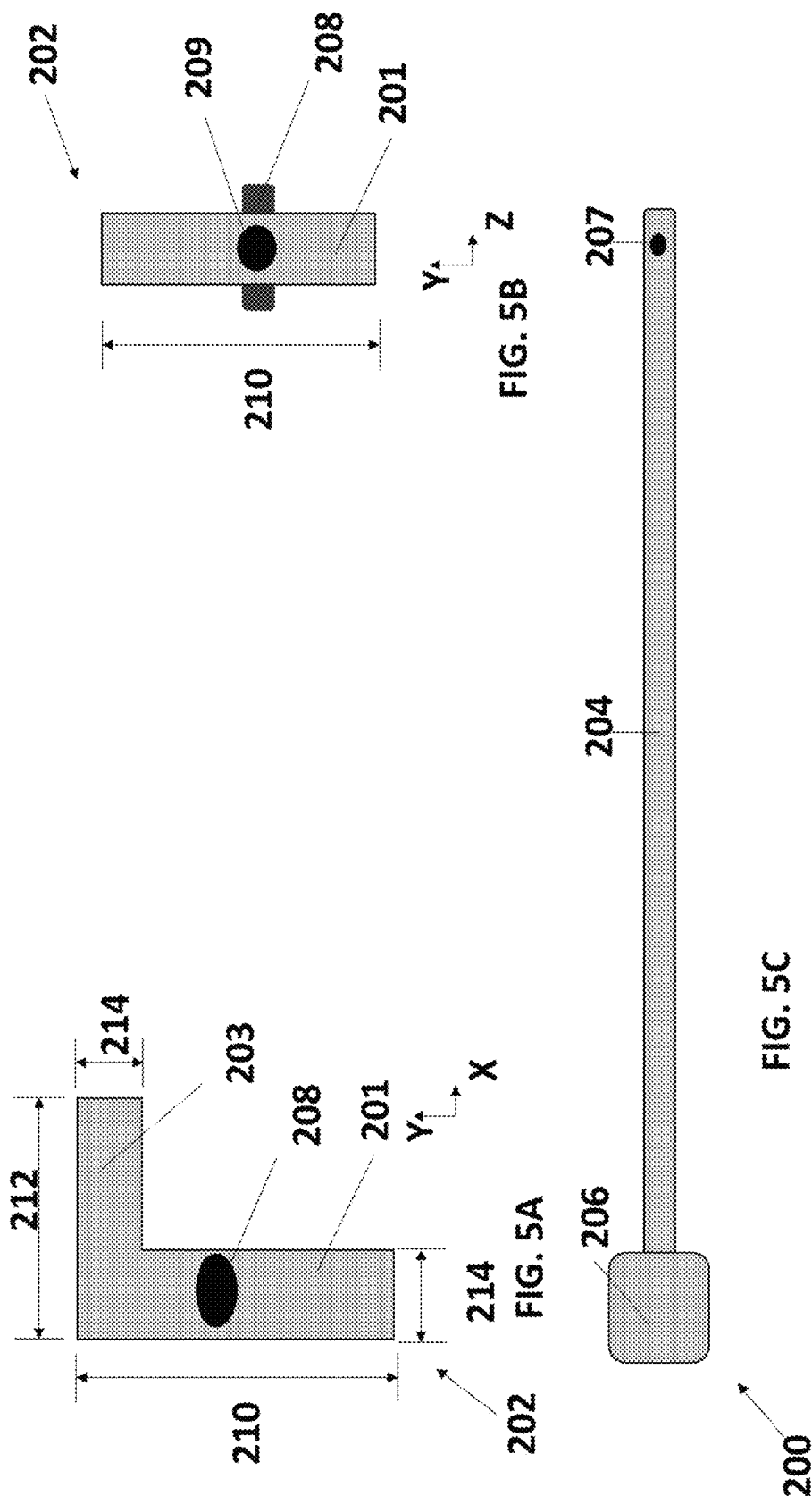

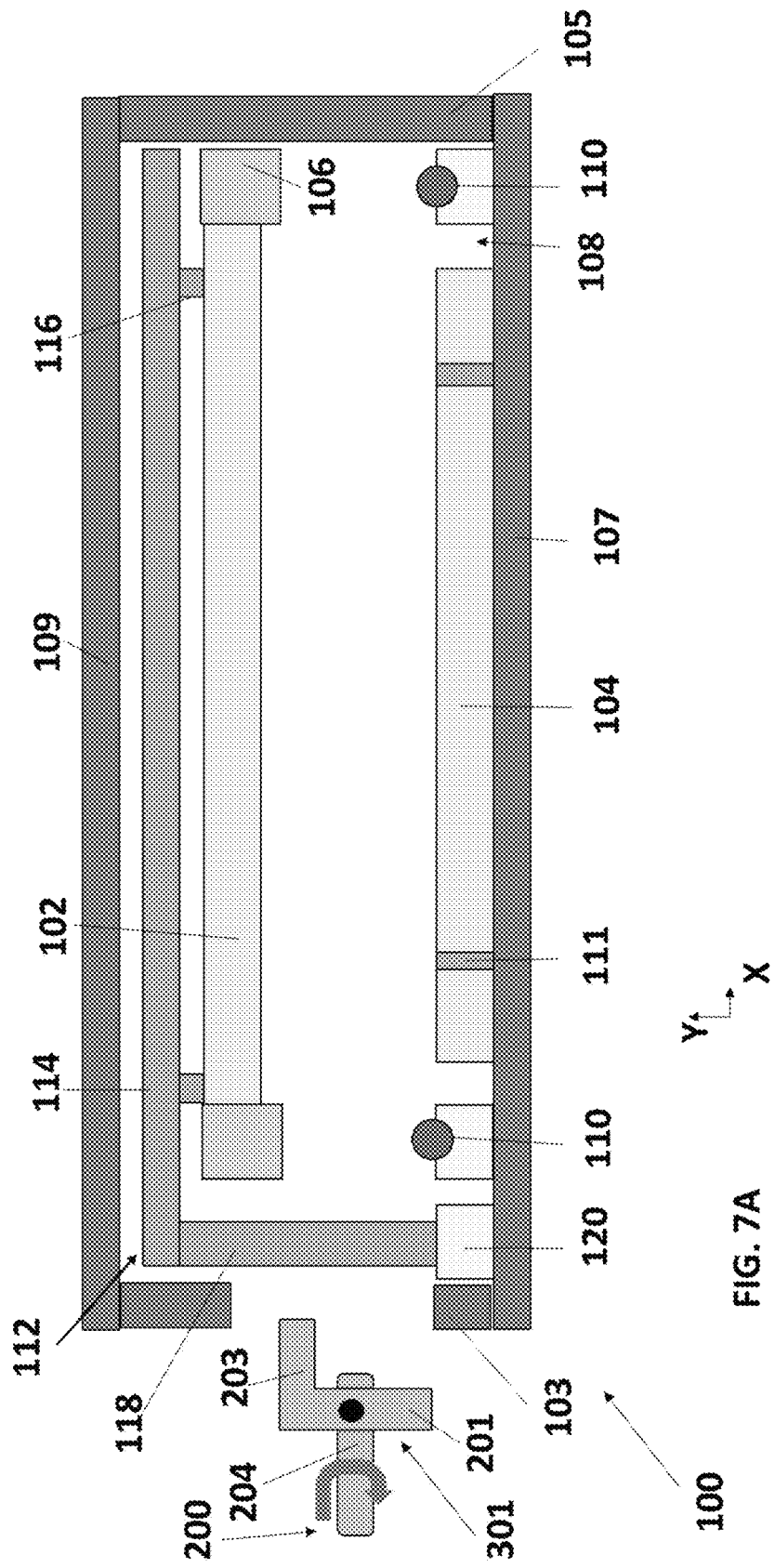

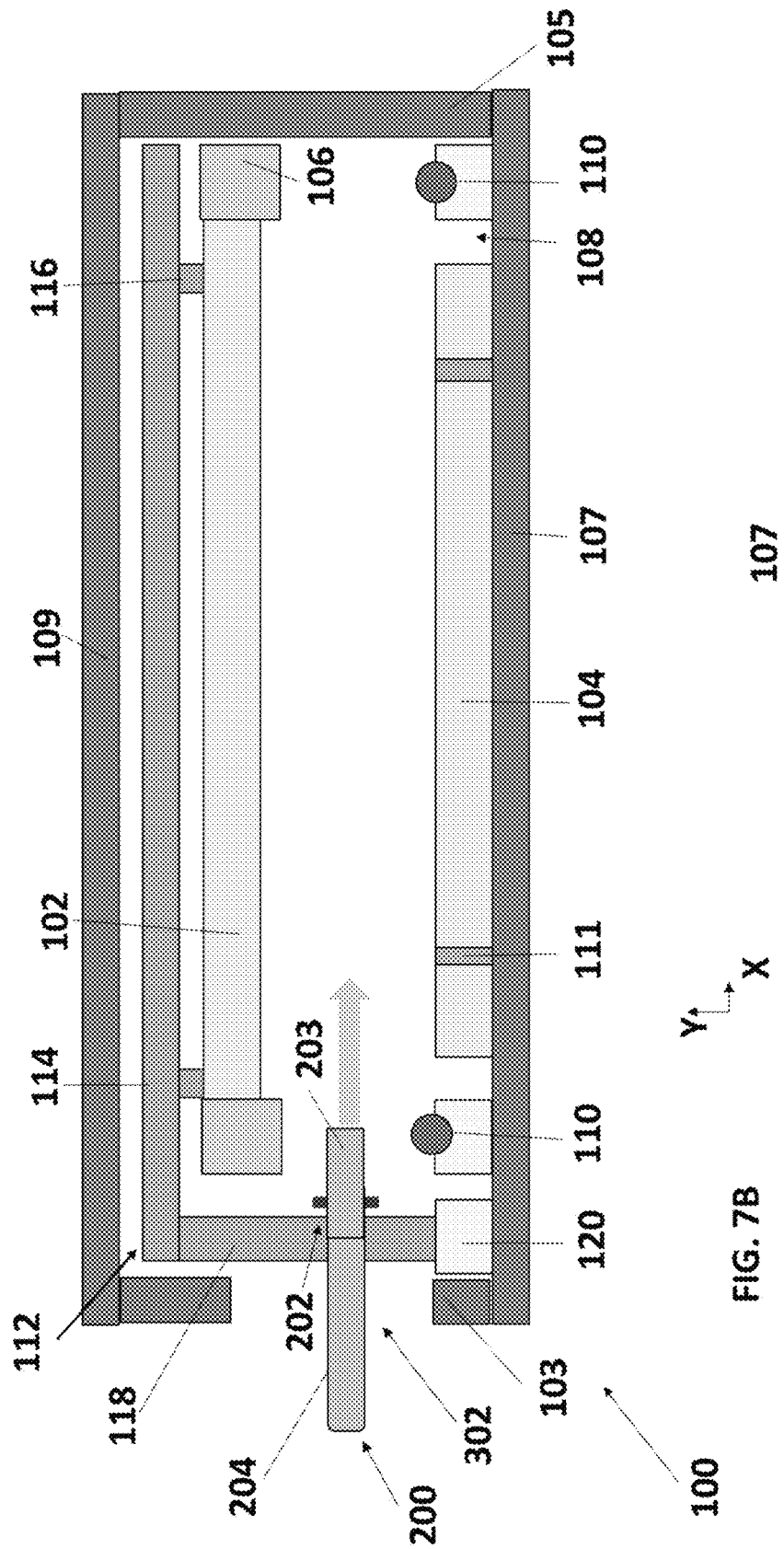

JIG FOR EVALUATING SEMICONDUCTOR PROCESSING CHAMBER

CROSS-REFERENCE TO RELATED APPLICATIONS

This application claims priority under 35 U.S.C. § 119 to U.S. Provisional Patent Application No. 62/635,535 filed on Feb. 26, 2018, the disclosure of which is incorporated by reference herein in its entirety.

TECHNICAL FIELD

The present disclosure relates to a jig for evaluating a semiconductor processing chamber.

BACKGROUND

Semiconductor processing tools present new challenges as they age. Process cycles and consistent use introduce strains and stresses on fixed parts. Over an extended amount of time, parts intended as a permanent fixture within the tools will start to sag and strain. Such sag may interfere with routine operations and result in damage to substrates and downtime.

SUMMARY

Exemplary embodiments of the inventive concept relate to an apparatus for evaluating semiconductor processing chambers. In an exemplary embodiment, the processing chamber includes a lid and a hot plate. The apparatus includes an L-shaped structure and a bar-shaped member. The L-shaped structure detachably connects to one end of the bar-shaped member, with a handle on the opposite end of the bar-shaped member. The bar-shaped member may detachably connect to the L-shaped structure with an attachment structure. The L-shaped structure has a first portion extending a first length in a first direction and a second portion extending a second length in a second direction, the second direction being substantially perpendicular to the first direction. The first length is greater than the second length, and both the first length and the second length are greater than the width of L-shaped structure. The L-shaped structure is shaped such that the L-shaped structure is configured to contact the lid of the processing chamber. If the L-shaped structure contacts the lid of the processing chamber, the lid is sagging out of tolerance. The lid of the processing chamber may have a lip around the edge, which protrudes in the first direction towards the hot plate. The second portion of the L-shaped structure is configured to contact the lip of the lid. Furthermore, the first portion of the L-shaped structure is configured to contact the base of the chamber which extends in the second direction. The base of the chamber may be a hot plate surrounded by an O-ring, with a slot extending in the second direction between the hot plate and the O-ring. The second portion of the L-shaped structure thus may have a length greater than distance between the hot plate and O-ring. The attachment structure may include a first and second hole in the L-shaped structure and a third hole in the bar-shaped member. The bar-shaped member may penetrate the first hole of the L-shaped structure, while the second hole of the L-shaped structure and the third hole of the bar-shaped member are aligned with a dowel penetrating both the second and third holes. The bar-shaped member may alternatively be screwed into the L-shaped structure, with the bar-structure having a threaded end which corresponds to a threaded first hole in the L-shaped structure. The L-shaped structure may be made of polytetrafluoroethylene, aluminum, or an alloy of aluminum. The bar-shaped member and the handle may be made of aluminum, or an alloy of aluminum. The second portion of the L-shaped structure may also have a length substantially equal to maximum handoff height for pins extending from a hot plate within the chamber. The width of the L-shaped structure may also be equal to the optimal distance between the lid and a path of a substrate handling robot.

In an exemplary embodiment, an apparatus includes an L-shaped structure and a bar-shaped member. The L-shaped structure has a first portion forming a first arm with a first end and a second end, with the first portion extending in the first direction, and a second portion forming a second arm extending from the first portion in a second direction that's substantially perpendicular to the first direction, the first portion extending in the first direction a first length, and the second portion extending in the second direction a second length that is less than the first length, and the second length is greater than a width of the first portion or the second portion. The L-shaped structure has first hole and a second hole crossing the first hole. The bar-shaped member is detachably coupled to the L-shaped structure, the bar-shaped member having a bar shape extending in the second direction. The bar-shaped member has a handle at a first end, and a third hole at a second end opposite the first end. A dowel penetrates the third hole of the bar shaped member and one of the first hole and the second hole. The other of the first hole and the second hole is penetrated by the bar shaped member. The second portion is configured to contact the lid of the chamber at a lip extending in the first direction from the lid when the first portion is in contact with the hot plate, and the contacting the lip indicates the lid is sagging out of tolerance. The first portion has a length substantially equal to a first optimal distance between the lid and the hot plate. The second portion has a length substantially equal to an optimal height of one or more pins extending from the hot plate. The second portion is configured to contact the lid of the chamber at a lip extending in the first direction from the lid when the portion arm is in contact with the hot plate, and the contacting the lip indicates the lid is sagging out of tolerance. The second portion may have the second length greater than the distance between the hot plate of the chamber and an O-ring surrounding the hot plate. The width of the L-shaped structure may have a third length equal to a second optimal distance between the lid and a path of a substrate handling robot.

In an exemplary embodiment, a method for evaluating a semiconductor processing chamber uses a jig placed initially outside the proximal side of the processing chamber. The processing chamber extends vertically in a first direction and horizontally in a second direction between a proximal end and a distal end. The processing chamber includes a lid extending substantially in the second direction, a hot plate below the lid extending substantially in the second direction substantially parallel to the lid, a lip around the lid and protrudes from the lip in the first direction toward the hot plate, and an O-ring around the hot plate and protruding in the first direction towards the lid. The jig includes a first member having an L-shape which is detachably coupled to a second member having a bar-shape. The L-shaped first member has a first portion extending in a first direction, and a second portion substantially perpendicular to the first portion extending in the second direction. The method includes placing a jig outside a proximal side of the semiconductor processing chamber, then inserting the jig, afterwards moving the jig from the proximal side of the processing chamber to a distal side of the processing chamber, and contacting the jig to the hot plate at the distal end of the hot plate. The first portion of the first L-shaped structure contacts the distal end of the hot plate, while the second portion extends in the second direction towards the lip of the lid. If the second portion of the first L-shaped structure is unable to contact the lid, the lid is sagging within tolerance. If the second portion of the first L-shaped structure contacts the lid, the lid is sagging out of tolerance. If the chamber is sagging out of tolerance, the lid is replaced, and the chamber is further qualified. The chamber may be qualified by removing the first L-shaped structure from the second bar shaped member. The first L-shaped structure is placed on the hot plate with the second portion perpendicular to the hot plate. One or more pins within the hot plate may be extended in the first direction to match the length of the second portion. The chamber may be further qualified by taking the detached first L-shaped structure and placing it on a substrate handling robot, with the width of the first L-shaped structure oriented perpendicular to the surface of the substrate handling robot. The distance between the first L-shaped structure and the substrate handling robot is adjusted to match the width of the L-shaped structure. The lid may be supported on the proximal side of the semiconductor processing chamber by one or more supports. When inserting the jig, the jig may first be rotated on the proximal side of the one or more supports such that the first portion and the second portion of the first L-shaped structure are parallel with the lid, then the jig may be moved in the distal direction further into the semiconductor processing chamber past the one or more supports, then rotated back such that the first portion extends in the first direction and the second portion extends in the second direction.

BRIEF DESCRIPTION OF THE DRAWINGS

The written disclosure herein describes illustrative embodiments that are non-limiting and non-exhaustive. Reference is made to certain of such illustrative embodiments that are depicted in the figures, as listed below.

FIGS. 4A, 4B, and 4C are side, top and bottom views of an apparatus according to an exemplary embodiment of the present inventive concept;

FIGS. 5A and 5B are schematic views from the side and front of a L-shaped structure of an apparatus, respectively, according to an exemplary embodiment of the present inventive concept;

FIG. 5C is a schematic view from the side of an apparatus when the L-shaped structure is removed;

FIGS. 7A-7E are schematic views of a series of motions of a jig according to an exemplary embodiment of the present inventive concept;

DETAILED DESCRIPTION OF EXEMPLARY EMBODIMENTS

Various exemplary embodiments will be described more fully hereinafter with reference to the accompanying drawings. The present inventive concept may, however, be embodied in many alternate forms and should not be construed as limited to the exemplary embodiments set forth herein. Rather, these exemplary embodiments are provided so that this description will be thorough and complete, and will fully convey the scope of the present inventive concept to those skilled in the art.

Figure 1:
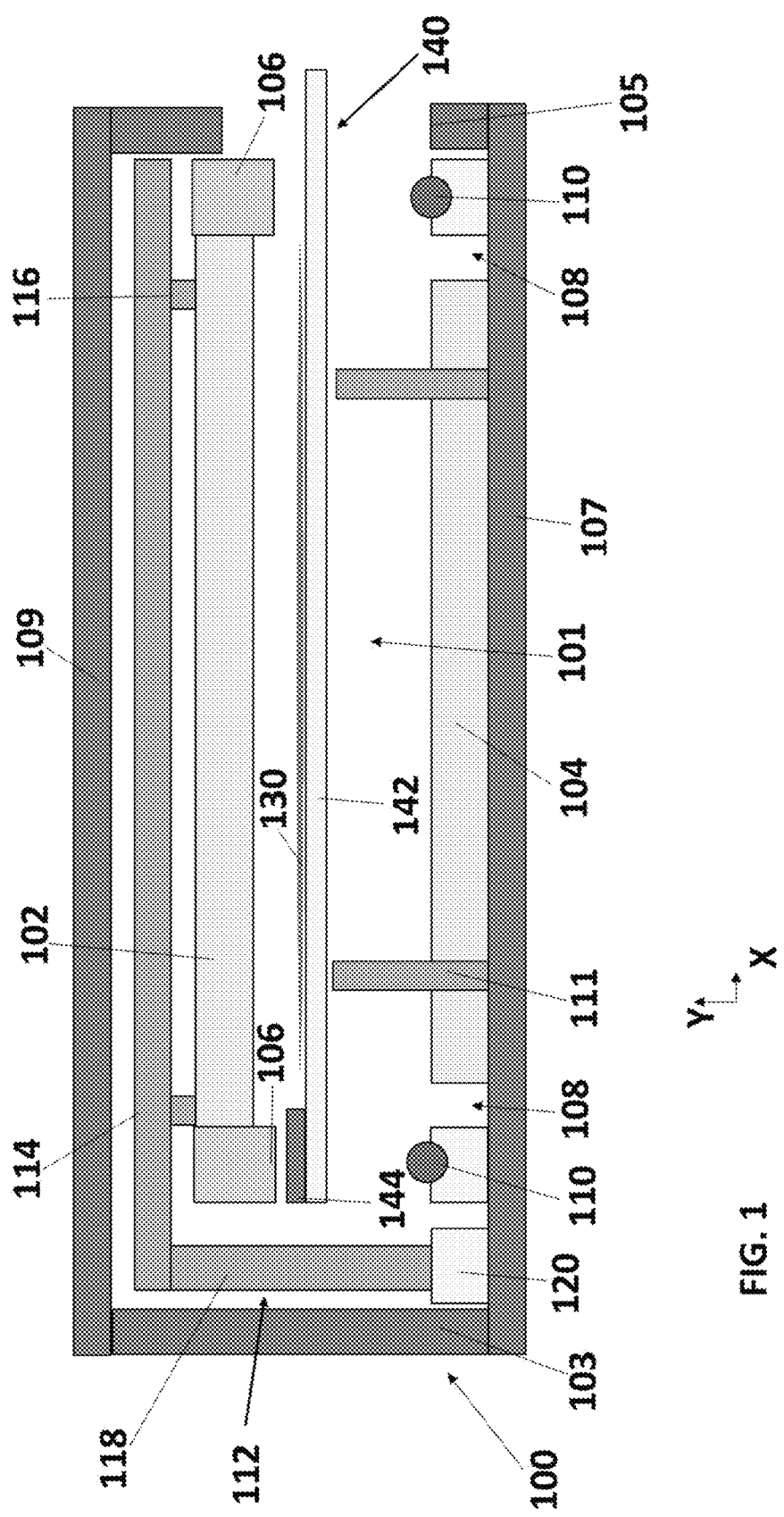
FIG. 1 is schematic view of a processing chamber according to an exemplary embodiment of the present inventive concept.

FIG. 1 is schematic view of a processing chamber 100. The processing chamber 100 extends vertically in a first direction or Y direction, and horizontally in a second direction, or X direction. The processing chamber 100 is a multipurpose semiconductor processing chamber, such as SEMES KSPIN chamber. The processing chamber 100 may also be referred to as a semiconductor processing chamber, or simply chamber. The processing chamber 100 may be used in a variety of processes, including processes related to photoresist, spin on hardmasks, anti-reflection coating, prebaking, post processing solvent removal, etc. The processing chamber 100 includes a set of walls defining the processing chamber 100, including a proximal wall 103 at a proximal end of the second direction, a distal wall 105 at a distal end of the second direction, and a bottom wall 107 and a top wall 109 forming the bottom end and top end of the first direction. The processing chamber 100 includes within it a lid 102 forming the ceiling of the processing chamber 100 and a hot plate 104 opposite the lid 102 which forms the base of the processing chamber 100, with both the lid 102 and the hot plate 104 extending substantially in the second direction. The hot plate 104 serves to heat a substrate within the processing chamber 100, such as via induction heating, or any other method known in the art. The lid 102 and the hot plate 104 may provide a processing space 101 in the processing chamber 100. By decreasing the effective size of the processing space 101, the lid 102 and the hot plate 104 can better control the conditions a wafer 130 is exposed to. For example, the lid 102 may serve to reflect heat from the hot plate 104, or the lid 102 may provide a clean non-reactive surface to prevent contamination. In an example embodiment, the lid 102 and the hot plate 104 may be spaced approximately 30 mm apart in the first direction.

The lid 102 is surrounded in the second direction by a lip 106 extending below the bottom of the lid 102 to form a protrusion in the first direction towards the hot plate 104. The hot plate 104 is surrounded in the second direction by a heat isolation slot 108 while an O-ring 110 surrounds the heat isolation slot 108 in the second direction and the O-ring 110 forms a protrusion towards the lid 102. The O-ring 110 and the lip 106 are substantially opposite each other and spaced apart in the first direction. The hot plate 104 includes one or more pins 111 which are raised or lowered in the first direction as part of a wafer transfer technique. A wafer 130 may be inserted by a substrate handling robot 140 into the processing space 101. The substrate handling robot 140 includes an arm 142 and a lead 144. The arm 142 in the embodiment shown is a single arm, but in other embodiments, multiple arms may be used, as well as chucks, such as e-chucks or mechanical chucks to hold the wafer 130 in place.

The lid 102 is a cantilevered lid. The lid 102 is held using a mounting assembly 112 to hold the lid 102. The mounting assembly 112 includes a mounting bracket 114, one or more mounting bolts 116, and one or more support arms 118. The mounting assembly 112 is held by a support base 120. The mounting bolts 116 mount the lid 102 onto the mounting bracket 114. The mounting bracket 114 is substantially parallel to the lid 102 and the hot plate 104 and substantially extends in the second direction. The one or more support arms 118 hold the mounting bracket 114 in place, and are orthogonal to the lid 102, the hot plate 104, and the mounting bracket 114, extending substantially in the first direction. The one or more support arms 118 are supported by the support base 120. The support base 120 may include, for example, bearings to hold the rest of mounting assembly 112 in place. In an exemplary embodiment, the support base 120 is closer to the side of the proximal wall 103 of the processing chamber 100. The one or more support arms 118 are extended to one end of the mounting bracket 114 in parallel to the side of the proximal wall 103.

Figure 2:
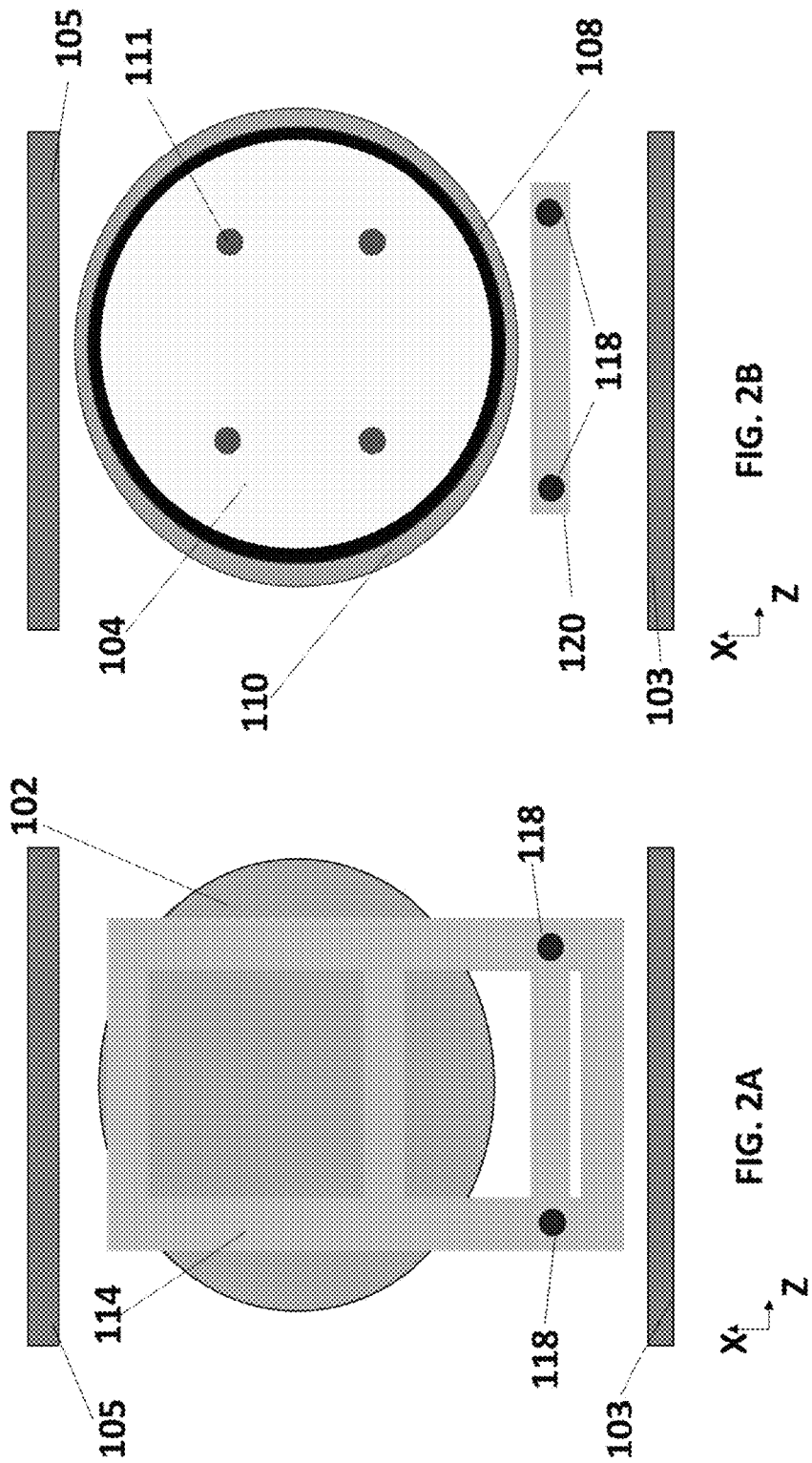
FIGS. 2A and 2B are plan views of a processing chamber at the level of a lid and at the level of a hot plate, respectively, according to an exemplary embodiment of the present inventive concept.

FIGS. 2A and 2B are plan views of a processing chamber at the level of the lid 102 and at the level of the hot plate 104, respectively shown extending in the second direction and in a third direction orthogonal to the first and second directions, also known as the Z direction. In FIG. 2A, the lid 102 and the mounting bracket 114 have a circular shape and a set of one or more bars forming a rectangular shape, respectively. In FIG. 2B, the hot plate 104 has a circular shape, and the heat isolation slot 108 has a circular shape surrounding the hot plate 104. The O-ring 110 has a circular shape surrounding the heat isolation slot 108. The support base 120 is separated from the O-ring 110 and closer to the proximal wall 103. In both FIGS. 2A and 2B, two support arms 118 overlap the support base 120. In FIGS. 2A and 2B, the support arms 118 are vertical structural members orthogonal to both the plane of the lid 102 and the plane of the hot plate 104. The support arms 118 may be spaced apart far enough to allow access from the side of the proximal wall 103, such as via a hatch.

The processing chamber 100 may have a circular shape, with the lid 102 and the hot plate 104 reflecting that circular shape. When the processing chamber 100 is in a circular shape, the distal wall 105 and proximal wall 103 may be understood as opposite ends of the chamber in the second direction and include such features as hatches or doors to access the processing chamber 100. Furthermore, having the lid 102 and the hot plate 104 in a circular shape may be beneficial when the substrate being processed is a wafer. Thus, in other embodiments, such as where the substrate is not a wafer, the shape of the lid 102 and the hot plate 104 may differ to match the shape of the substrate. Furthermore, in still other embodiments, the processing chamber 100 may have a rectangular or polygonal shape while the shape of the lid 102 and hot plate 104 may remain circular. The number of the one or more pins 111 may be determined by shape of the hot plate 104 and the wafer 130. For example, in FIG. 2B, the one or more pins 111 are four individual pins, in a rectangular layout. However, the number of the one or more pins 111 may vary, as well as the shape of the layout. For example, three pins in a triangular shape may be used depending on the shape of the substrate handling robot 140.

Figure 3:
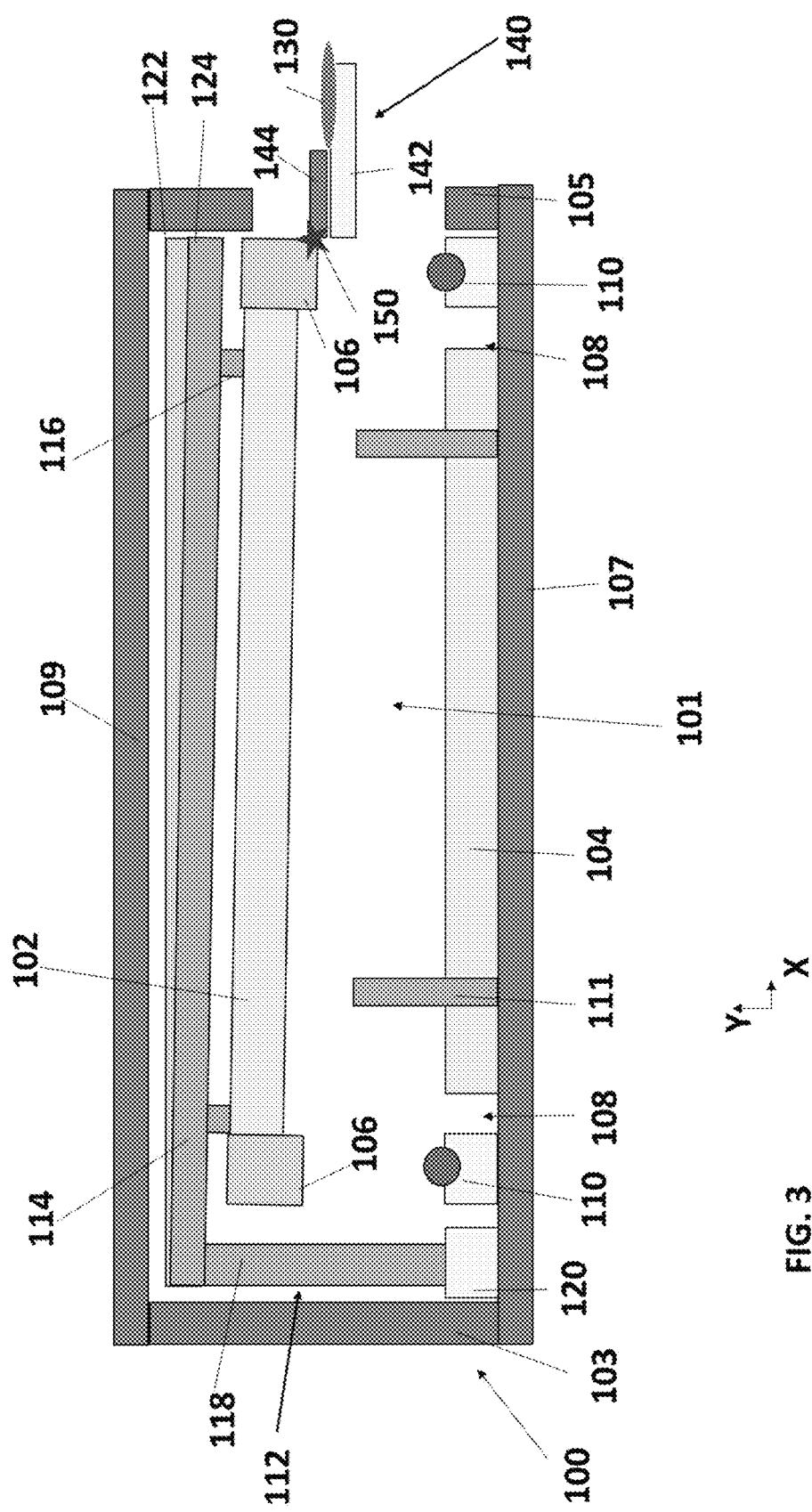
FIG. 3 is a schematic view of a sagging processing chamber having a wafer strike.

FIG. 3 is a schematic view of a sagging processing chamber having a wafer strike. In FIG. 3, the processing chamber 100 has the lid 102 sagging. The lid 102 sags over time due to the stress and strain experienced by the support base 120, allowing the rest of the mounting assembly 112, including the support arm 118, the mounting bracket 114, the mounting bolts 116, to tilt in the direction of the distal wall 105. The sag is illustrated in FIG. 3 by the original position 122 versus the sagging position 124 of the mounting bracket 114. The sag can be measured either in the angle of sag or in the linear displacement from the original position 122 of the mounting bracket 114. Measuring the displacement of the distal end of the lid 102 allows quantifying the sag of the lid 102 with a single distance measurement. In an exemplary embodiment, the displacement of the distal end of the lid 102 may be represented by a change in the distance in the first direction between a top surface of the hot plate 104 and a bottom surface of the lip 106. In other words, since the lip 106 is displaced in the first direction toward the hot plate 104 due to sag of the lid 102, the hot plate 104 may serve as a reference when using a jig to determine whether the sag of the lid 102 is within tolerance or does not cause collision between the substrate handling robot 140 and the lip 106 at the entry of the substrate handling robot 140 into the processing chamber 100.

When the lid 102 sags far enough, the lid 102 may interfere with the path of the substrate handling robot 140. For example, FIG. 3 shows a collision 150 where the lead 144 of the arm 142 strikes the lip 106 of the lid 102. Such a collision may shatter the wafer 130, resulting in not only lost product but also a substantial downtime as the processing chamber 100 must be cleaned and requalified. For example, when the total distance between the lid 102 and the hot plate 104 is 30 mm, a displacement of a distal end of the lid 102, for example, less than 5 mm inclusive, may be allowed for the path of a substrate handling robot 140 to avoid a collision 150.

FIGS. 4A, 4B, and 4C are side, top and bottom views of a jig 200. FIG. 4A shows a side view of the jig 200, while FIG. 4B shows a top view of the jig 200, and FIG. 4C shows a bottom view of the jig 200. The jig 200 includes a multipurpose block in the form of an L-shaped structure 202, a bar-shaped member 204 and a handle 206. The bar-shaped member 204 has a proximal end with handle 206 and a distal end where the L-shaped structure 202 is detachably coupled to the bar-shaped member 204. The handle 206 allows a user to grip the jig 200. The bar-shaped member 204 and the handle 206 may be made of aluminum or an aluminum alloy, for example. The L-shaped structure 202 may be made of aluminum, an aluminum alloy, or polytetrafluoroethylenes, such as Teflon. The bar-shaped member 204 is of sufficient length to allow the user to hold the handle 206 outside of a processing chamber 100 and move the L-shaped structure 202 from side of the proximal wall 103 to the side the distal wall 105 of the chamber without the handle 206 entering the processing chamber 100. Furthermore, the handle 206 and the bar-shaped member 204 may extend even further, with a length such that a user may use one hand on the handle 206 and another hand on the bar-shaped member 204 to stabilize the motion of the jig 200. In some embodiments, the length of the bar-shaped member 204 is longer than a width of the processing chamber 100. In some embodiments, the bar-shaped member 204 or the handle 206 may include markings indicating the orientation of the jig 200. The bar-shaped member 204 may also be known as a pole or extending member.

FIGS. 5A and 5B are schematic views from the side and front of the L-shaped structure 202 of the jig of FIG. 4A, respectively. FIG. 5C is a schematic view of the bar-shaped member 204 without the L-shaped structure 202 attached. In FIG. 5A, the L-shaped structure 202 is an L-shaped block, which includes a first portion 201 forming a first arm, and a second portion 203 forming a second arm, the first portion 201 and the second portion 203 being substantially perpendicular to each other in order to form an L shape. The L-shaped structure 202 includes three sides, a first side along the first portion 201 of a first length 210, a second side along the second portion 203 of a second length 212, and a third side along the width of the L-shaped structure 202 of a third length 214. The first portion 201 has the first length 210 extend in the first direction orthogonally to the bar-shaped member 204 and attached by using an attachment structure formed by both the L-shaped structure 202 and the bar-shaped member 204 including a dowel 208. The dowel 208 is a small rod or member that fits through both the L-shaped structure 202 and the bar-shaped member 204 to secure them to each other but allow for the L-shaped structure 202 to be removable from the jig 200. The dowel 208 fits within a hole within the side of the L-shaped structure 202.

In FIG. 5B, the dowel 208 extends from the body of the L-shaped structure 202. The body of the L-shaped structure 202 includes part of the attachment structure, such as a first hole 209 for receiving the bar-shaped member 204 as well as a second hole for the dowel 208. For example, the bar-shaped member 204 may extend through the first hole 209 of the L-shaped structure 202. The first hole 209 may be on the first portion 201 of the L-shaped structure 202, with a second hole shown in FIG. 5B filled by dowel 208. The bar-shaped member 204 may include additional features of the attachment structure, such as a third hole 207 aligned with the second hole of the L-shaped structure that allows the dowel 208 to slide through both the bar-shaped member 204 and the L-shaped structure 202 and thereby secure the L-shaped structure 202 on the bar-shaped member 204. In some embodiments, the dowel 208 may include guide pins or a stopper to secure the dowel 208 in the L-shaped structure 202 and the bar-shaped member 204. In other embodiments, the dowel 208 may be threaded to match threads in the second hole of the L-shaped structure 202 and/or threads in the third hole 207 of the bar-shaped member 204. In still other embodiments, the L-shaped structure 202 may be secured to the bar-shaped member 204 directly, without a dowel, such as with a clamp or by screwing the bar-shaped member 204 directly into the L-shaped structure 202 by including a first set of threads on the distal end of the bar-shaped member 204 matching a second set of threads in the first hole 209, and having the first set of threads detachably couple with the second set of threads.

By giving the L-shaped structure 202 an L-shape, the L-shaped structure 202 may have each of the three sides acting as a template for various parts of a processing chamber 100. Thus, the jig 200 may be a multipurpose measurement jig. In the example embodiment of FIG. 4A and FIG. 5A, the first length 210 of the first portion 201 may be used as a template to detect the sag of the lid 102.

The first portion 201 may have the first length 210 set at a predetermined percentage of tolerance of the distance between the lid 102 and the hot plate 104 at the distal end of the lid 102. The first length 210 is substantially equal to a first optimal distance in the first direction between the lid 102 of the processing chamber 100 and the hot plate 104 which is set at the predetermined percentage of tolerance of the distance between a bottom surface of the lid 102 and a top surface of the hot plate 104 at the distal end of the lid 102.

The second portion 203 may have the second length 212 set equal to the maximum height of the one or more pins 111 which may be raised in the first direction within the processing space 101. The second length 212 may also be greater than the width of the heat isolation slot 108.

The L-shaped structure 202 may have a width with the third length 214 set substantially equal to a second optimal distance in the first direction between the lid 102 and a path of the substrate handling robot 140 within the semiconductor processing chamber. The path of the substrate handling robot 140 while entering and exiting the processing chamber 100 may be substantially in parallel in the second direction to a top surface of the hot plate 104 and may be substantially parallel in the second direction to the bottom surface of the lid 102 when the lid 102 is not sagging. The second optimal distance is a distance in the first direction between the lid 102 and the path of the substrate handling robot 140 entering the processing chamber 100.

Referring to FIG. 4A and FIG. 5A, the first portion 201 may have the first length 210 allowing a sag of 40% tolerance. Sagging exceeding this 40% will be referred to as sagging out of tolerance. A sag of 40% tolerance is a length of 28 mm when the initial distance between the lid 102 and the hot plate 104 is 30 mm apart with a 5 mm distance between the lid 102 in the non-sagging state and the path of the substrate handling robot 140, creating a maximum possible tolerance of 5 mm. Thus, by setting the first length 210 to 28 mm, a sag of 2 mm, or 40% tolerance, will be detected. In other embodiments, the distance between the lid 102 and either or both the hot plate 104 and the path of the substrate handling robot 140 may differ, and thus the optimal distance for the first length 210 will vary. Furthermore, in other embodiments, the first portion 201 may have the first length 210 correspond to a different sag tolerance, for example less than 40% or more than 40%. In still more embodiments, both the distances between the lid 102 the hot plate 104 and the path of the substrate handling robot 140 as well as the sag tolerance may differ. In the example embodiment of FIG. 4A, the first portion 201 having the first length 210 equal to 40% of sag tolerance allows the jig 200 to determine if the lid 102 is sagged enough to be replaced or repaired so as to prevent potential collisions with the substrate handling robot 140 or wafer 130. As sag is caused by progressive wear on the mounting assembly 112, over time the sag will increase. Measuring a sag of 40% allows for the sag to be detected prior to any possible collision between the lid 102 and the substrate handling robot 140 carrying on a wafer. The tolerance may be altered in other embodiments to reflect differences in the mounting assembly 112.

Additionally, by giving the L-shaped structure 202 the shape of an L, the L-shaped structure 202 may be useful in measuring the distance between the lip 106 of the lid 102 and the hot plate 104. Since the lip 106 protrudes from the surface of the lid 102 and forms the outer parameter of the lid 102, the lip 106 is the most likely location to strike the substrate handling robot 140. Furthermore, as the lip 106 may be on the farthest point of the lid 102 (or the cantilevered arm) supported by the mounting assembly 112, the lip 106 is the lowest point of sag. The lip 106 is above the O-ring 110, and the O-ring 110 is separated from the hot plate 104 by the heat isolation slot 108. The O-ring 110 is a compressible surface. As such, a template may not accurately measure the distance between the O-ring 110 and the lid 102 or the lip 106. By using an L-shape for the L-shaped structure 202, however, the first portion 201 may form a template for the distance between the hot plate 104 and the lid 102 with the first length 210, and when the lid 102 sags beyond tolerance limits, the second portion 203 extends out far enough to contact the lip 106, extending over the heat isolation slot 108. If sag is within tolerance limits, the second portion 203 of the jig 200 does not touch the lip 106. Thus, the L-shaped structure 202 may be used as a template to identify whether the sag of the lid 102 is within tolerance limits.

Figure 6A:
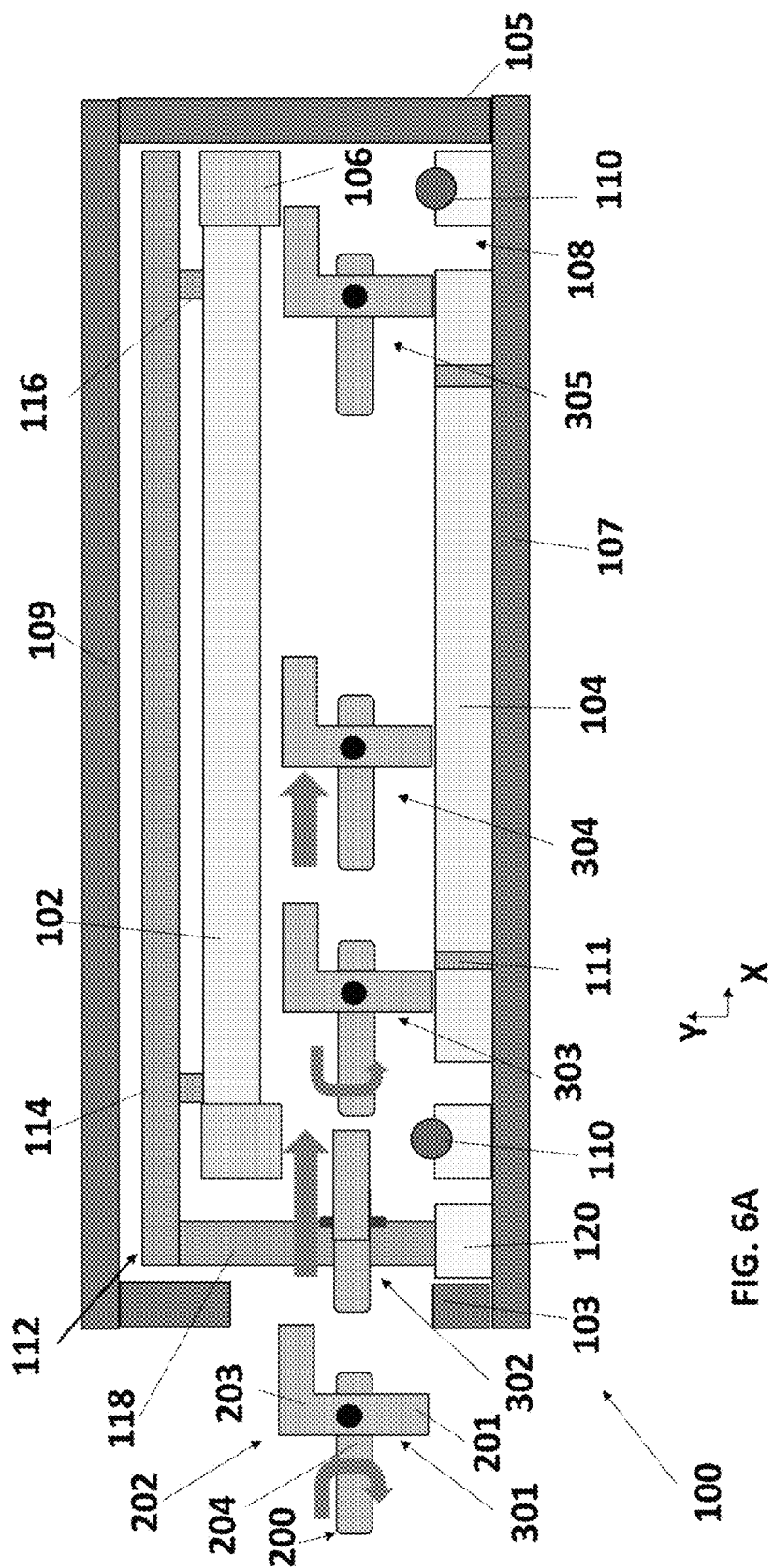
FIG. 6A is a sequence view of the movements of an L-shaped structure within a process chamber according to an exemplary embodiment of the present inventive concept.
Figure 6B:
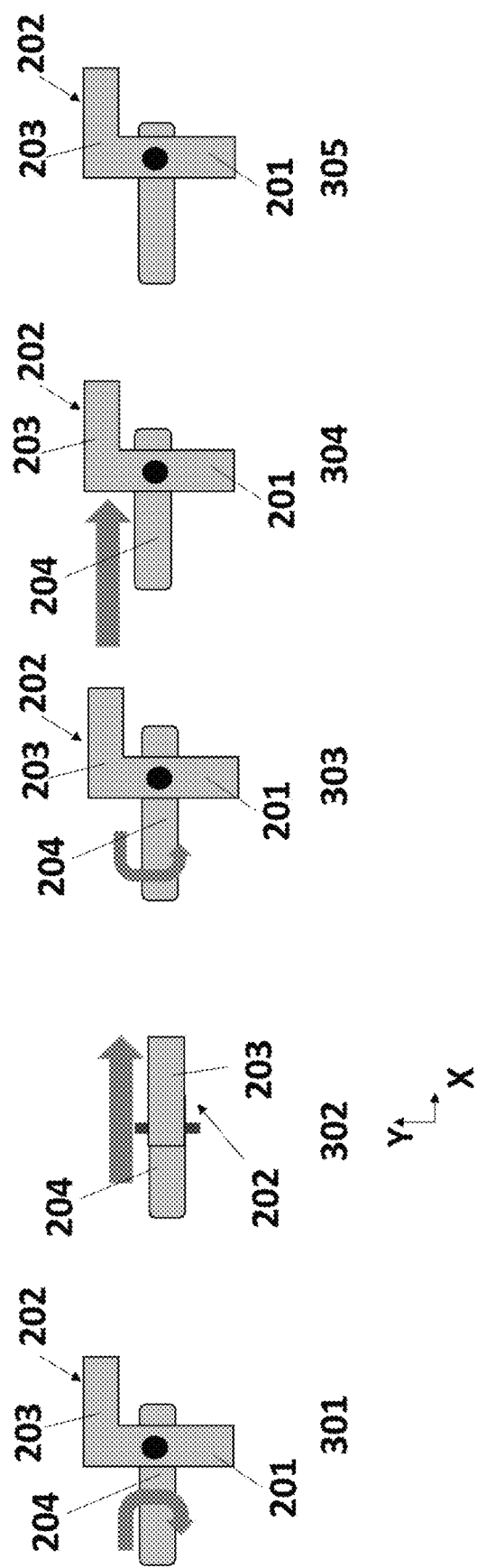
FIG. 6B is a sequence view of the movements of an L-shaped structure according to an exemplary embodiment of the present inventive concept.

Hereinafter, it will be described how a jig is used as a template to identify whether sag of a lid is within tolerance limits with reference to FIGS. 6A, 6B and 7A-7E. FIG. 6A is a sequence view of the movements of a jig within a process chamber. FIG. 6B is a sequence view of the movements of a jig within a process chamber. FIGS. 7A-7E are schematic views of a series of motions of a jig within a process chamber. FIG. 6A shows the individual movements of the jig 200 with respect to the L-shaped structure 202 via a first movement 301, a second movement 302, a third movement 303, a fourth movement 304, and a fifth movement 305. FIG. 6B shows the corresponding motion of the L-shaped structure 202 alone. FIGS. 7A-7E break down the movements of the L-shaped structure 202 as shown in FIG. 6A and FIG. 6B into the individual movements with the jig 200 having the L-shaped structure 202 attached.

Referring to FIG. 7A, initially, the jig 200 is held with the L-shaped head of the L-shaped structure 202 held outside the processing chamber 100. The second portion 203 of the L-shaped structure 202 is aligned in parallel to a top surface of the hot plate 104, with the second portion 203 oriented up towards the lid 102. The first movement 301 has the jig 200 including the L-shaped structure 202 rotated 90 degrees around a longitudinal axis of the bar-shaped member 204. The L-shaped structure 202 may be too large to fit between the lid 102 and the O-ring 110, in which case the first movement allows the L-shaped structure 202 to be inserted into the processing chamber 100. Thus, the second movement 302 pushes the jig 200 further into the processing chamber 100, through an opening of the proximal wall 103 toward the distal wall 105.

Figure 7C:
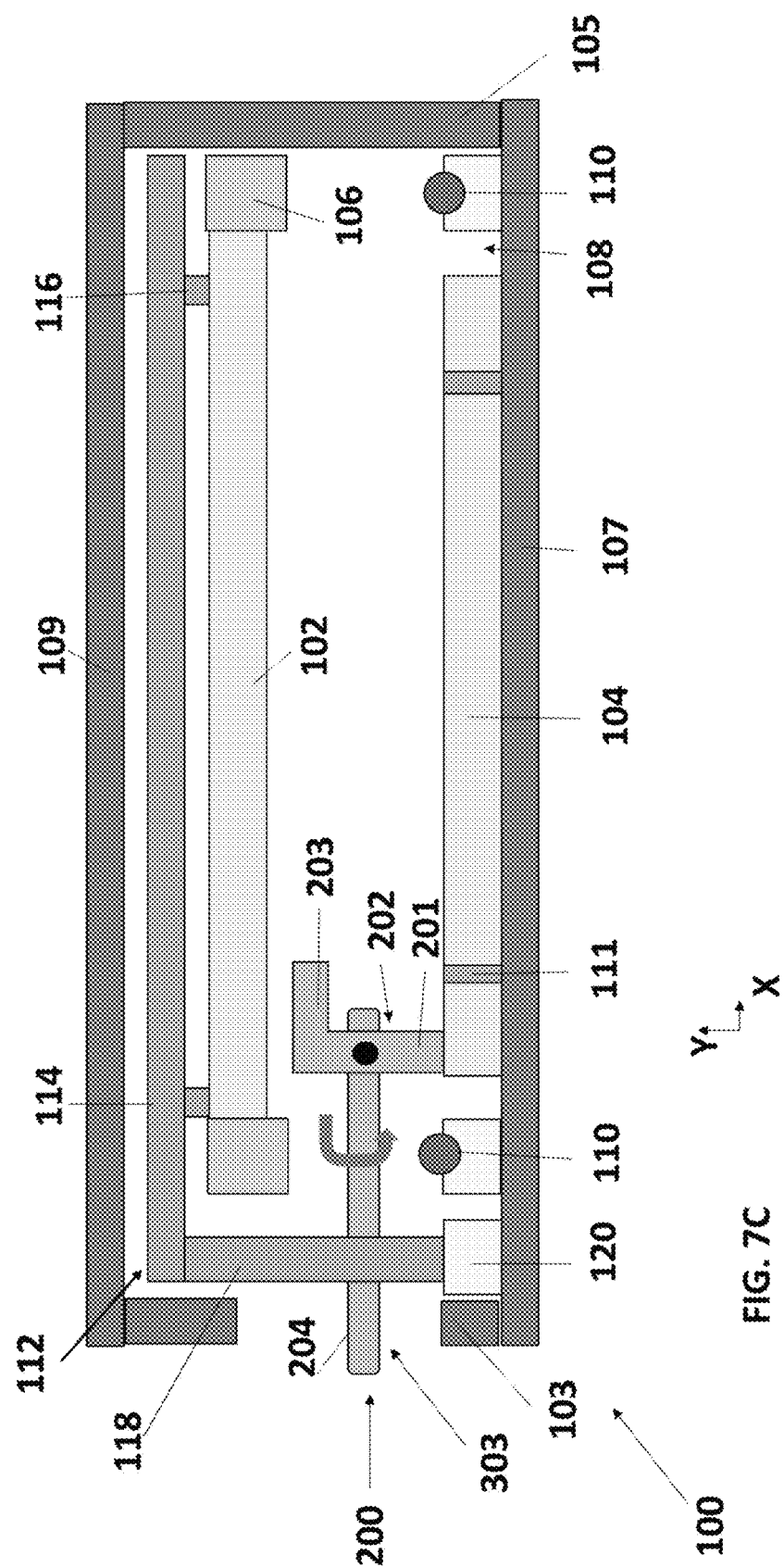

Referring to FIGS. 7B and 7C, the second movement 302 pushes the jig 200 past the one or more support arms 118, and past the O-ring 110. After the second movement 302, the third movement 303 rotates the jig 200 back to the position before the first movement 301, with the second portion 203 of the L-shaped structure 202 facing towards the lid 102 so that the first portion 201 of the L-shaped structure 202 touches on the top surface of the hot plate 104.

Figure 7D:
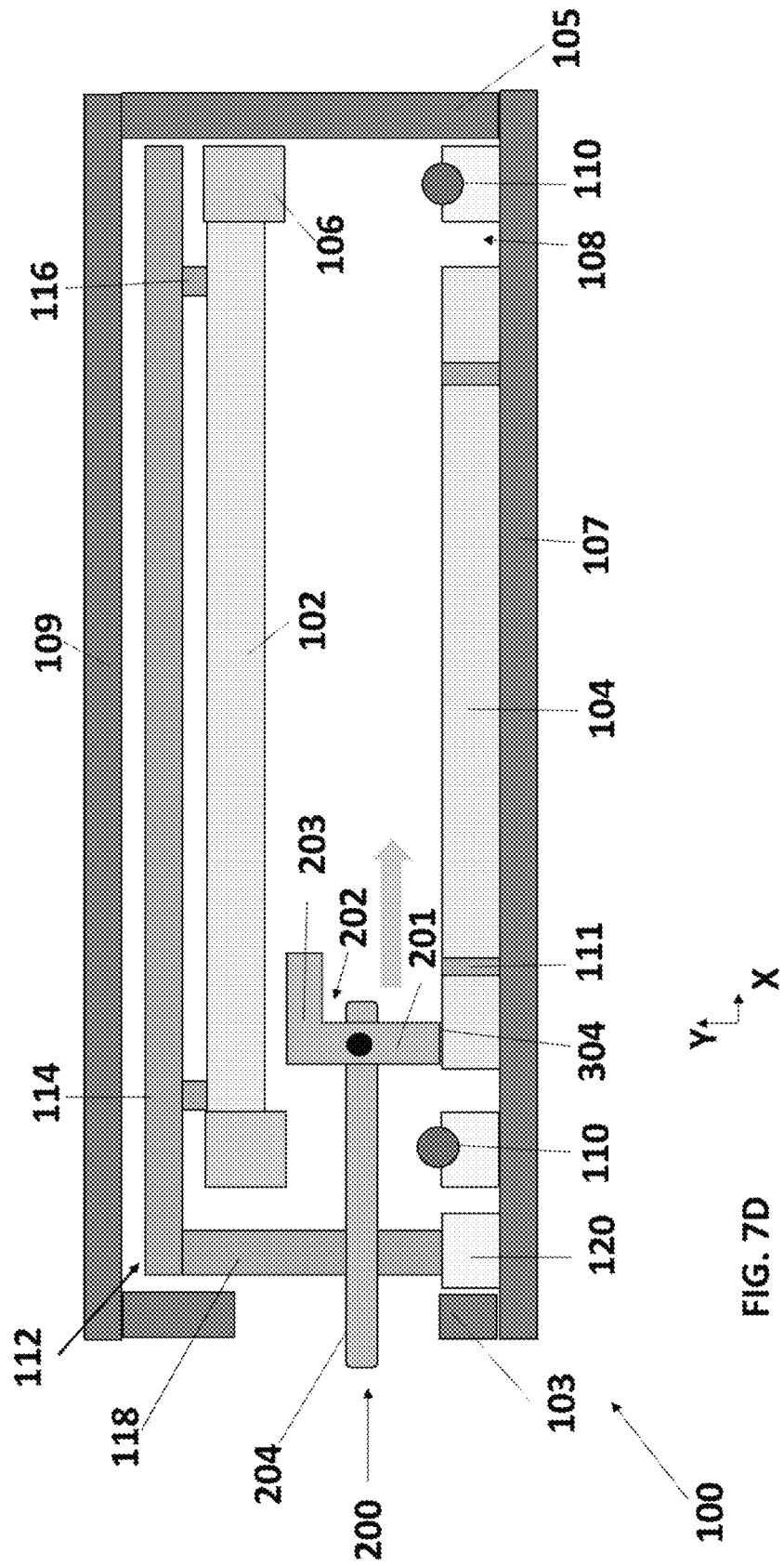

Referring to FIG. 7D, the fourth movement 304 then pushes the L-shaped structure 202 further into the processing chamber 100, towards the distal wall 105. The first portion 201 of the L-shaped structure 202 slides on the top surface of the hot plate 104.

Figure 7E:
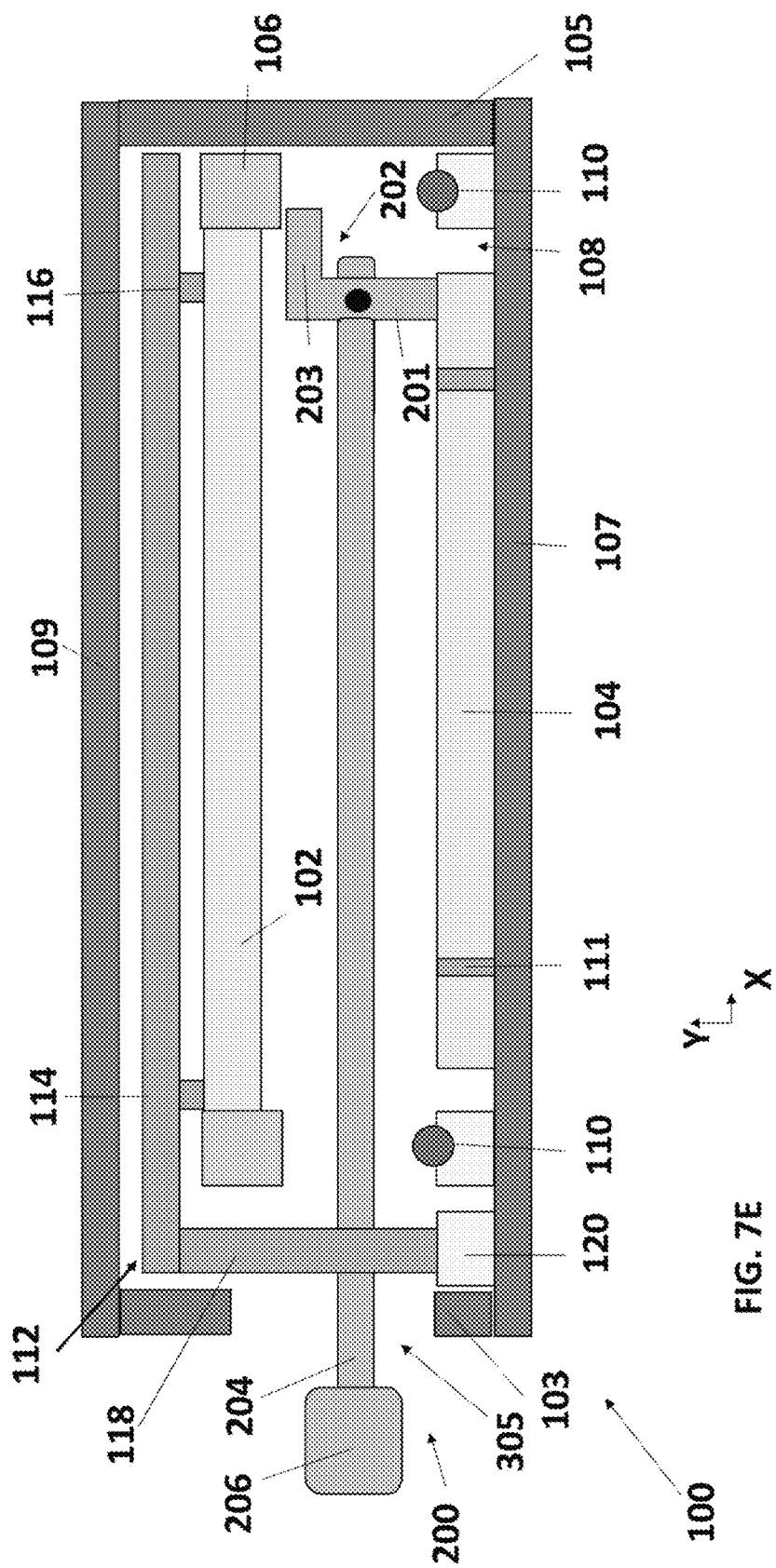

Referring to FIG. 7E, the fifth movement 305 may have the second portion 203 of the L-shaped structure 202 to touch a bottom surface of the lip 106. In this case, sag of the lid 102 is identified as within tolerance limits. In an exemplary embodiment, the second portion 203 of the L-shaped structure 202 may be positioned under the bottom surface of the lip 106 without contacting the lip 106. In this case, sag of the lid 102 is identified as within tolerance limits.

In a processing chamber meeting tolerance limits regarding sag of the lid 102, the L-shaped structure 202 will not contact the lid 102 when the L-shaped structure 202 is also contacting the hot plate 104. Furthermore, in some embodiments, the lip 106 may be recessed sufficiently that the L-shaped structure 202 may contact the distal wall 105.

Figure 8:
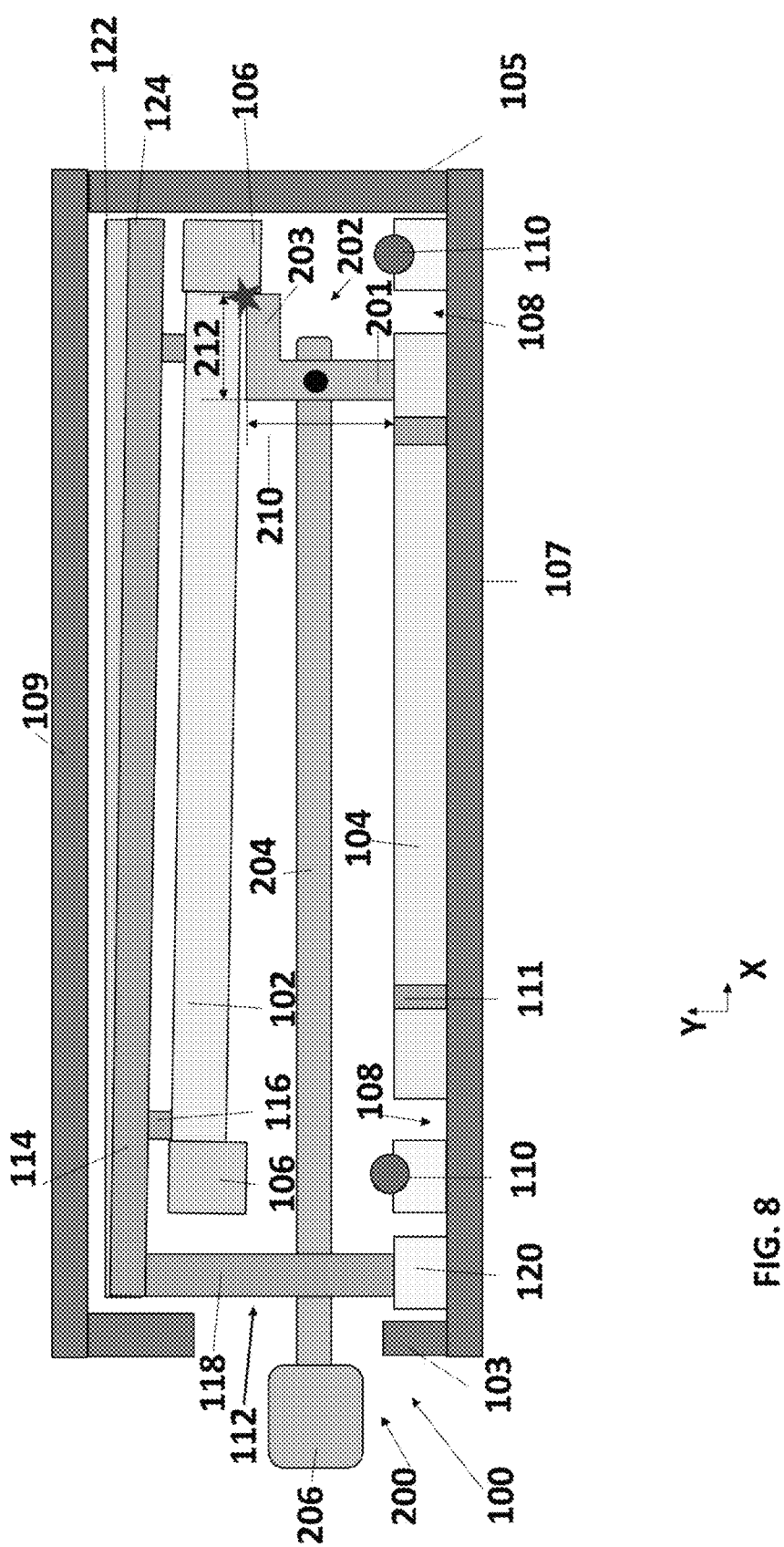
FIG. 8 is a schematic view of a sagging processing chamber contacting a jig according to an exemplary embodiment of the present inventive concept.

Hereinafter, it will be described that the lid 102 is sagged out of tolerance limits with reference to FIG. 8. The jig 200 including the L-shaped structure 202 will contact the lid 102 prior to reaching the distal end of the hot plate 104. The first portion 201 has the first length 210 such that jig 200 will ordinarily contact the lid 102 only at the lip 106 when the lid 102 sags about 40% between the distance of the lid 102 in the original position 122 and a sagging position 124. However, if the sagging is more severe, the jig 200 will contact the lid 102 before contacting the lip 106. Furthermore, the second portion 203 has the second length 212 such that the first portion 201 may contact the hot plate 104 while the second portion extends over the heat isolation slot 108 to touch the lip 106. When the jig 200 contacts the lid 102, the operator may feel the jig 200 contacting the lid 102 with the force of contact transmitting via the bar-shaped member 204 L-shaped structure 202. Thus, the processing chamber 100 may be taken offline for a replacement of the lid 102 and/or the rest of the mounting assembly 112. Performing this procedure may thus be done during a regular round of maintenance, for example, during a weekly preventive maintenance test. Verifying the sag of the lid 102 thus may be done easily with the jig 200 acting as a template, even while the oven is at a high operating temperature. Regular testing with the jig 200 may be done to prevent catastrophic failure resulting in wafer breakage and extended down time.

Hereinafter, a multipurpose block in the form of the L-shaped structure 202 will be described with reference to FIGS. 9 and 10. The L-shaped structure 202 may be further used during a qualification process for the processing chamber 100 after replacement of the lid 102, as well as during qualifications of the hot plate 104 or the substrate handling robot 140.

Figure 9:
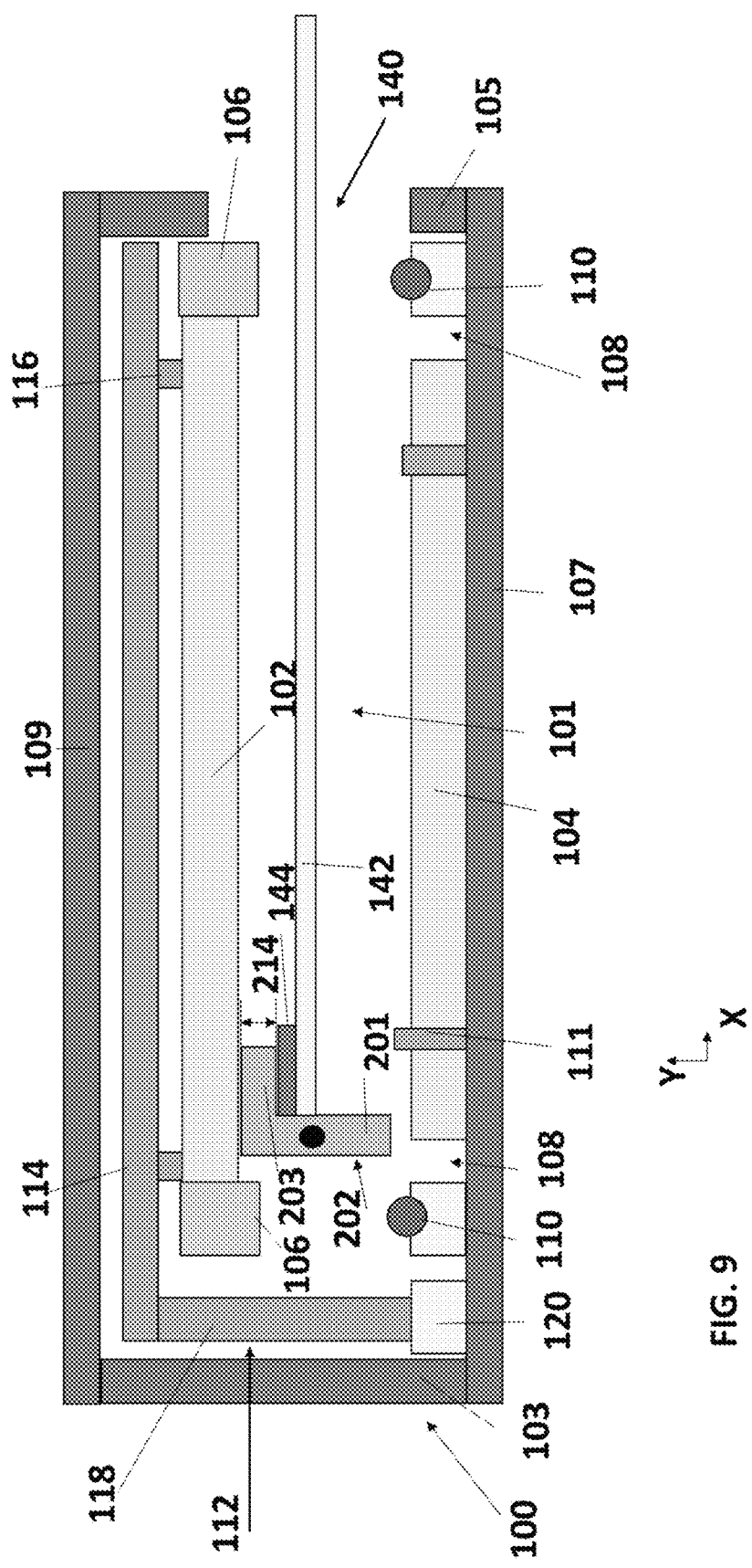
FIG. 9 is a schematic view of a multipurpose block on a substrate handling robot according to an exemplary embodiment of the present inventive concept.

FIG. 9 is a schematic view of a multipurpose block on a substrate handling robot, specifically, for a qualification process for the lid 102 and/or the substrate handling robot 140. After determining the lid is sagging beyond tolerance, a new lid 102 may replace the old lid 102. However, the new lid 102 must be qualified before the process chamber 100 is placed back in surface. The L-shaped structure 202 may be detached from the bar-shaped member 204 and placed on the lead 144 of the arm 142 of the substrate handling robot 140. The L-shaped structure 202 is placed such that the first portion 201 is orthogonal to major surfaces of the lead 144 and the lid 102. The first portion 201 of the L-shaped structure 202 having a width of the third length 214 will allow only the substrate handling robot 140 to move in the second direction from the side of the distal wall 105 toward the side of the proximal wall 103 with the L-shaped structure 202 fitting between the lead 144 and the lid 102. If the distance between the L-shaped structure 202 mounted on the arm 142 is too small for the substrate handling robot 140 to move, the new lid 102 must be adjusted. Similarly, if the distance between the L-shaped structure 202 mounted on the arm 142 is noticeable, the substrate handling robot 140 and the new lid 102 will required further adjustments.

Figure 10:
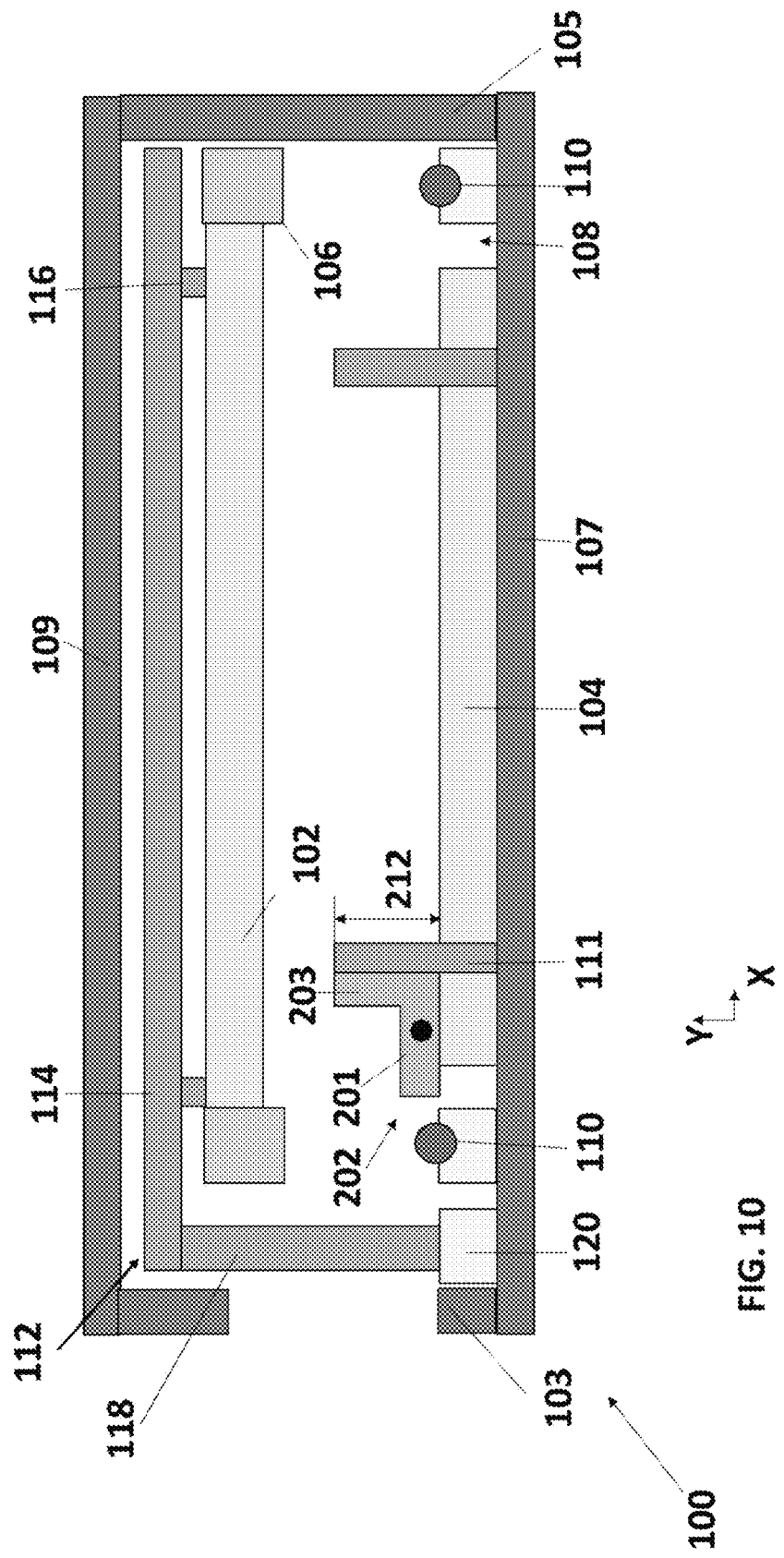
FIG. 10 is a schematic view of a multipurpose block on a hot plate jig according to an exemplary embodiment of the present inventive concept.

FIG. 10 is a schematic view of a multipurpose block on a hot plate. For example, the second portion 203 of the L-shaped structure 202 has the second length 212 serve as a template for the hot plate 104 and the one or more pins 111. The L-shaped structure 202 may be removed from the bar-shaped member 204 with the first portion 201 placed flat on the hot plate 104. The one or more pins 111 may then be raised to match the height of the second portion 203 of the L-shaped structure 202. Each pin of the one or more pins 111 may be individually adjusted to match the template created by the second portion 203 until they have a height equal to the second length 212. In an exemplary embodiment, the second portion 203 of the L-shaped structure 202 has the second length 212 substantially equal to a maximum height for the one or more pins 111 within the processing chamber 100. In other words, the maximum height of the one or more pin 111 may be calibrated using the second portion 203 of the L-shaped structure 202.

While exemplary embodiments of the present inventive concept have been particularly shown and described, it will be understood by one of ordinary skill in the art that variations in form and detail may be made therein without departing from the spirit and scope of the attached claims.

The invention claimed is:

1. An apparatus comprising:
an L-shaped structure including a first portion with a first length, and a second portion with a second length; and
a bar-shaped member detachably secured to the L-shaped structure with an attachment structure, the bar-shaped member including a handle at one end, and the bar-shaped member detachably secured to the L-shaped structure at an opposite end with the attachment structure,
wherein the first length is greater than the second length, and the second length is greater than a width of the first portion or the second portion.

2. The apparatus of claim 1, wherein the L-shaped structure is configured to contact a lid of a chamber, and wherein the L-shaped structure contacting the lid indicates the lid is sagging out of tolerance.

3. The apparatus of claim 2, wherein the second portion of the L-shaped structure is configured to contact a lip of the lid, the lip of the lid protruding substantially perpendicularly from the lid.

4. The apparatus of claim 3,
wherein the first portion of the L-shaped structure is configured to contact a base of the chamber,
the base of the chamber comprising a hot plate surrounded by an O-ring, with a slot extending between the hot plate and the O-ring, and the O-ring protruding substantially perpendicularly from the hot plate, and
wherein the second length of the second portion of the L-shaped structure is greater than a distance between the hot plate and the O-ring.

5. The apparatus of claim 2, wherein the second length of the second portion of the L-shaped structure is substantially equal to a maximum height of one or more pins extending in the substantially perpendicularly from a hot plate of the chamber.

6. The apparatus of claim 2, wherein the width of the L-shaped structure is substantially equal to a distance between the lid and a path of a substrate handling robot.

7. The apparatus of claim 1, wherein the attachment structure comprises:
a dowel;
a first hole and a second hole crossing each other in the L-shaped structure; and
a third hole in the bar-shaped member,
wherein the first hole is sized to fit an end of the bar-shaped member, and the second hole is sized to fit the dowel within the third hole of the bar-shaped member; and
wherein the bar-shaped member penetrates the first hole of the L-shaped structure, and the dowel penetrates the second hole of the L-shaped structure and the third hole of the bar-shaped member.

8. The apparatus of claim 1, wherein the attachment structure comprises:
a first set of threads on one end of the bar-shaped member; and
a first hole on the L-shaped structure, the first hole including a second set of threads,
wherein the first set of threads on the bar-shaped member are configured to detachably couple to the second set of threads on the L-shaped structure.

9. The apparatus of claim 1, wherein the L-shaped structure comprises polytetrafluoroethylene.

10. The apparatus of claim 1, wherein the bar-shaped member comprises aluminum or an aluminum alloy.

11. An apparatus comprising:
an L-shaped structure including a first portion with a first length, and a second portion with a second length,
wherein the first length is greater than the second length, and the second length is greater than a width of the first portion or the second portion,
wherein the L-shaped structure further includes a first hole and a second hole crossing the first hole,
a bar-shaped member detachably secured to the L-shaped structure, the bar-shaped member including a handle at one end and a third hole at an opposite end; and
a dowel penetrating the third hole of the bar-shaped member and one of the first hole and the second hole,
wherein the other of the first hole and the second hole is penetrated by the bar-shaped member,
wherein the L-shaped structure is configured to contact a lip of a lid of a chamber, and
wherein the L-shaped structure contacting the lip indicates the lid is sagging beyond tolerance.

12. The apparatus of claim 11, wherein the first length is equal to a first distance between the lid of the chamber and a hot plate of the chamber.

13. The apparatus of claim 12, wherein the second length is equal to a height of one or more pins extending from the hot plate, and wherein the second length is greater than a distance between the hot plate of the chamber and an O-ring surrounding the hot plate.

14. The apparatus of claim 13, wherein the width of the L-shaped structure has a third length equal to a second distance between the lid and a path of a substrate handling robot.

15. A method of evaluating a chamber,
wherein the chamber extends vertically in a first direction and horizontally in a second direction between a proximal end and a distal end, wherein the chamber comprises a lid substantially extending in the second direction, a hot plate extending in the second direction and parallel to the lid, a lip surrounding the lid and protruding in the first direction towards the hot plate, and an O-ring surrounding the hot plate and protruding in the first direction towards the lid, and
wherein a jig comprises a first L-shaped structure detachably coupled to a second bar-shaped member, the first L-shaped structure having a first portion extending in the first direction, and a second portion extending in the second direction,
the method comprising:
placing the jig outside the proximal end of the chamber;
inserting the jig;

moving the jig in the first direction from the proximal end of the chamber to the distal end of the chamber; and contacting the jig to the hot plate on the distal end of the hot plate.

16. The method of claim 15, wherein contacting the jig to the distal end of the hot plate comprises contacting the distal end of the hot plate with the first portion of the first L-shaped structure, with the second portion of the first L-shaped structure extending in the second direction towards the lip of the lid.

17. The method of claim 16, wherein contacting the jig to the distal end of the hot plate without contacting the lid indicates the chamber is sagging within tolerance.

18. The method of claim 16, wherein contacting the jig to the distal end of the hot plate while contacting the lid indicates the chamber is sagging is out of tolerance.

19. The method of claim 18, further comprising:

replacing the lid if the chamber is sagging out of tolerance; and qualifying the chamber after replacing the lid, qualifying the chamber comprising:

detaching the first L-shaped structure from the second bar-shaped member and placing the first L-shaped structure on the hot plate with the second portion perpendicular to the hot plate;

extending a set of one or more pins within the hot plate from within the hot plate to match a length of the second portion;

placing the first L-shaped structure on a substrate handling robot with a width of the first L-shaped perpendicular to a surface of the substrate handling robot extending in the second direction; and adjusting a distance in the first direction between the substrate handling robot and the lid to match the width of the L-shaped structure.

20. The method of claim 15, wherein the lid is supported on the proximal end of the chamber by one or more supports, and wherein inserting the jig comprises rotating the jig on a proximal side of the one or more supports such that the first portion and the second portion are substantially parallel to the hot plate, moving the jig into the chamber in the first direction towards the distal end of the chamber past the one or more supports, and rotating the jig such that the first portion extends in the first direction and the second portion extends in the second direction.

* * * * *